United States Patent
Cho et al.

[19]

[11] Patent Number: 6,077,776
[45] Date of Patent: *Jun. 20, 2000

[54] POLYSILICON RESIDUE FREE PROCESS BY THERMAL TREATMENT

[75] Inventors: Ching-Wen Cho, Nan-Tao; Cheng-Fu Hsu, Taichung; Sen-Fu Chen, Taipei; Po-Tao Chu, Hsinchu, all of Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/040,434

[22] Filed: Mar. 18, 1998

[51] Int. Cl.[7] ................................................ H01L 21/4763
[52] U.S. Cl. .......................... 438/647; 438/585; 438/684; 438/906; 438/787; 438/719; 438/694; 438/303; 438/657
[58] Field of Search ..................................... 438/647, 585, 438/684, 719, 906, 299, 694–695, 787–790, 780–782, 303, 657

[56] References Cited

U.S. PATENT DOCUMENTS

| | | | |
|---|---|---|---|
| 5,030,590 | 7/1991 | Amini et al. | 437/233 |
| 5,228,950 | 7/1993 | Webb et al. | 156/643 |
| 5,514,621 | 5/1996 | Tabara | 438/585 |
| 5,554,563 | 9/1996 | Chu et al. | 437/190 |
| 5,610,105 | 3/1997 | Vines et al. | 437/235 |
| 5,635,102 | 6/1997 | Mehta | 428/428 |
| 5,858,847 | 1/1999 | Zhou et al. | 438/305 |

OTHER PUBLICATIONS

Wolf "Silicon Processing for the VLSI Era" vol. 1 pp. 516–519, 1986.

*Primary Examiner*—Charles Bowers
*Assistant Examiner*—Thanh Nguyen
*Attorney, Agent, or Firm*—George O. Saile; Stephen B. Ackerman; Rosemary L.S. Pike

[57] ABSTRACT

A new method of removing impurities and moisture from the surface of a wafer and thereby preventing polysilicon residue is described. A dielectric layer is provided over the surface of a semiconductor substrate. A polysilicon layer is deposited overlying the dielectric layer. A hard mask layer is deposited overlying the polysilicon layer and patterned to form a hard mask. The wafer is cleaned whereby moisture and impurities form on the surfaces of the hard mask and the polysilicon layer. Thereafter, the wafer is heat treated whereby the moisture and impurities are removed. Thereafter, the polysilicon layer is etched away where it is not covered by the hard mask to complete formation of a polysilicon line on a wafer in the fabrication of an integrated circuit.

19 Claims, 5 Drawing Sheets

POLYSILICON RESIDUE FREE PROCESS BY THERMAL TREATMENT

BACKGROUND OF THE INVENTION

(1) Field of the Invention

The invention relates to a method of polysilicon etching in the fabrication of integrated circuits, and more particularly, to a method of preventing polysilicon residues in the polysilicon etching process in the manufacture of integrated circuits.

(2) Description of the Prior Art

In the manufacture of integrated circuit devices, it is necessary to maintain an ultra clean wafer surface in order to obtain high quality devices. $NH_4OH$—$H_2O_2$ (APM), HCl—$H_2O_2$ (HPM), and $H_2SO_4$—$H_2O_2$ (SPM) are efficient in removing organic or metallic impurities, but these cleaning processes will leave the surface of wafers in a hydrophillic state due to the oxidizing nature of peroxide ($H_2O_2$). There are at least two problems associated with this fact. If the surface of the wafer is an undensified tetraethoxysilane (TEOS) film, this film will absorb moisture hydrogen from the ambient or the wet cleaning process. Also, the hydrophillic surface could retain some impurities from the cleaning chemicals. The moisture and impurities will be converted into volatile defects and act as a mask during the subsequent polysilicon etching process.

FIG. 1 illustrates a portion of a partially completed integrated circuit device. Polysilicon layer 16 has been formed over a gate oxide layer 14 on a semiconductor substrate 10. A TEOS oxide layer 20 is formed over the polysilicon layer 16. The TEOS oxide layer is patterned to form a hard mask for etching the polysilicon. After this patterning, the wafer is cleaned using one of the conventional cleaning chemicals listed above. Impurities and moisture droplets 25 form on the surface of the wafer, due to the mechanisms discussed above.

When the polysilicon is etched away where it is not covered by the TEOS oxide hard mask 20, the impurities 25 will also act as a mask. Polysilicon residue 17 will remain in the areas masked by the impurities, as illustrated in FIG. 2. It is desired to find a method to remove the moisture and impurities before the polysilicon etch in order to prevent polysilicon residue.

U.S. Pat. No. 5,610,105 to Vines et al teach a vacuum bake followed by an annealing process in the preparation of a dielectric layer in order to minimize the amount of water, hydrogen, and hydrocarbon present in the dielectric layer. U.S. Pat. No. 5,554,564 to Chu et al shows an in-situ hot bake treatment that prevents precipitate formation after a contact layer etchback step. U.S. Pat. No. 5,635,102 to Mehta teaches selectively removing a porous silicon oxide layer containing absorbed moisture. U.S. Pat. No. 5,030,590 to Amini et al teaches removing polysilicon residues using a dilute hydroxide solution. U.S. Pat. No. 5,228,950 to Webb et al discloses removing polysilicon residues using $NF_3$ gas in a vacuum chamber. None of these references address the problem of removing impurities and moisture on the wafer surface before the polysilicon etch.

SUMMARY OF THE INVENTION

A principal object of the present invention is to provide an effective and very manufacturable method of removing impurities and moisture from a wafer surface.

A further object of the invention is to provide a method for removing impurities and moisture from the surface of a wafer before polysilicon etching.

A still further object of the invention is to provide a method for removing impurities and moisture from the surface of a wafer before polysilicon etching in order to prevent polysilicon residues.

Yet another object is to provide a method for removing impurities and moisture from a hydrophillic surface of a wafer before polysilicon etching in order to prevent polysilicon residues.

In accordance with the objects of this invention a new method of removing impurities and moisture from the surface of a wafer is achieved. A dielectric layer is provided over the surface of a semiconductor substrate. A polysilicon layer is deposited overlying the dielectric layer. A hard mask layer is deposited overlying the polysilicon layer and patterned to form a hard mask. The wafer is cleaned whereby moisture and impurities form on the surfaces of the hard mask and the polysilicon layer. Thereafter, the wafer is heat treated whereby the moisture and impurities are removed. Thereafter, the polysilicon layer is etched away where it is not covered by the hard mask to complete formation of a polysilicon line on a wafer in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
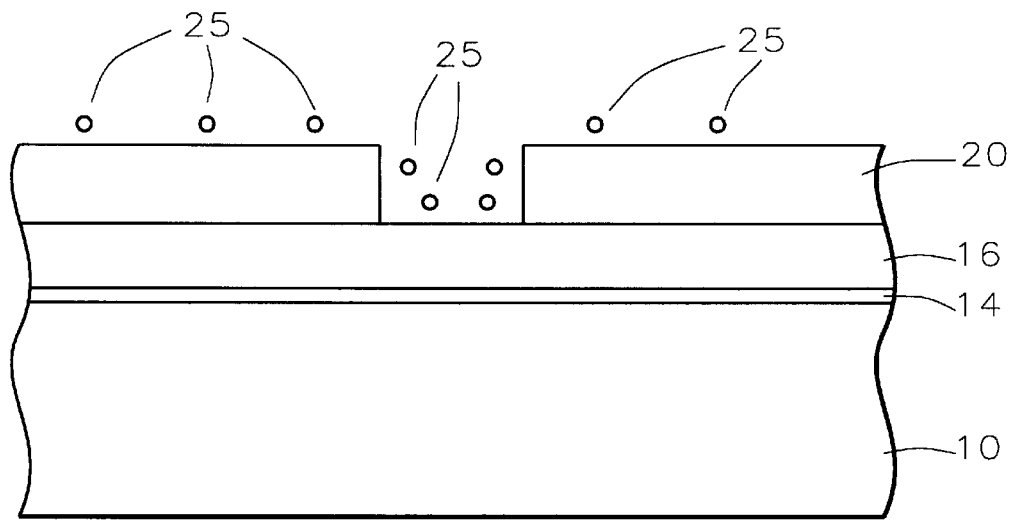
FIGS. 1 and 2 schematically illustrate in cross-sectional representation the polysilicon residue problem of the prior art.
Figure 2:
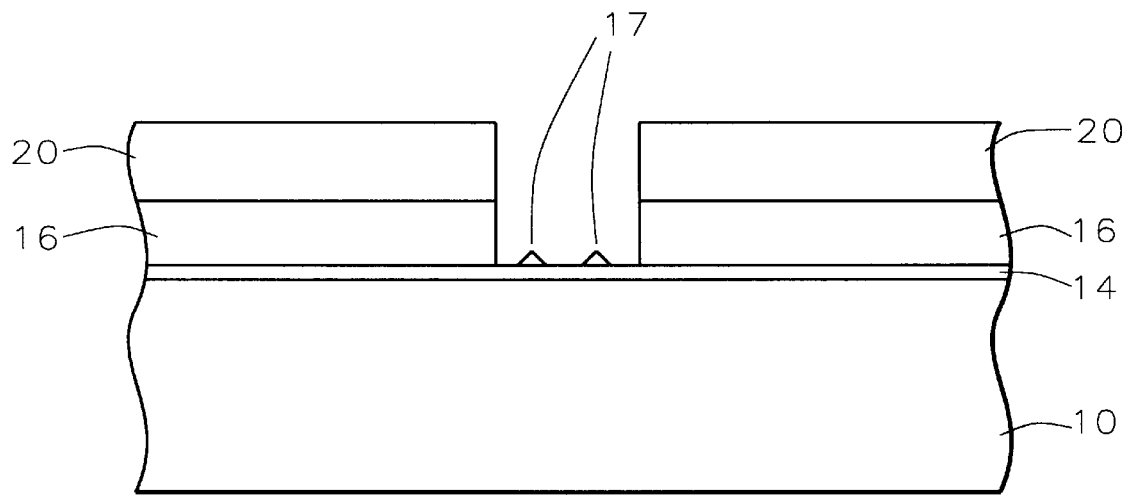
Figure 3:
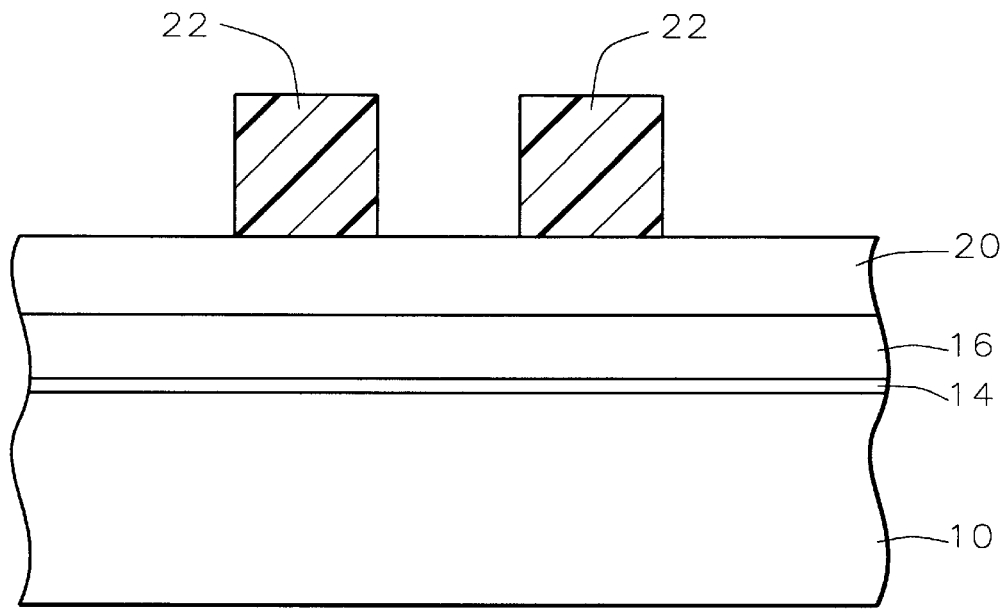
FIGS. 3 through 6 and 8 schematically illustrate in cross-sectional representation a preferred embodiment of the present invention.

Referring now more particularly to FIG. 3, there is illustrated a portion of a partially completed integrated circuit. There is shown a semiconductor substrate 10, preferably composed of monocrystalline silicon. The semiconductor substrate may be a bare silicon wafer on which a first layer of polysilicon is to be formed and patterned to provide gate electrodes and polysilicon interconnection lines, or the like. Alternately, the substrate 10 may already contain semiconductor device structures such as gate electrodes and source and drain regions and the like, not shown.

A dielectric layer 14 is deposited over the surface of the semiconductor substrate. This may be a gate oxide layer grown or deposited over a bare silicon substrate, or it may be an insulating layer deposited over semiconductor device structures already formed in and on the semiconductor substrate.

A layer of polysilicon 16 is deposited over the dielectric layer 14. A TEOS oxide film 20 is deposited over the polysilicon layer. This TEOS layer will act as a hard mask when the polysilicon layer is patterned to provide for better dimension control of the polysilicon gate. Other hard mask materials known in the art could be used in place of the TEOS oxide material.

Figure 4:
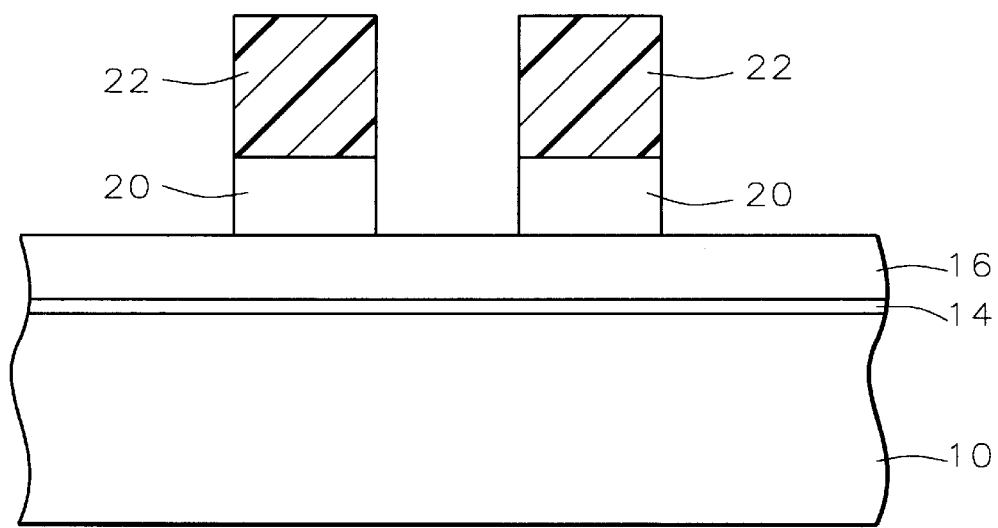

A photoresist layer is coated over the surface of the TEOS layer 20 and patterned to form the photoresist mask 22. The TEOS layer is patterned using the photoresist mask 22, as is conventional in the art. FIG. 4 shows the patterned TEOS layer 20. The photoresist mask 22 is stripped. The wafer must now be cleaned to remove photoresist residue and clean the wafer.

Conventional cleaning solutions contain peroxide. These solutions are effective in removing organic or metallic impurities. Such cleaning solutions include $NH_4OH$—$H_2O_2$ (APM), HCl—$H_2O_2$ (HPM), and $H_2SO_4$—$H_2O_2$ (SPM) After the wafer surface is cleaned, the surface of the wafer, including both the TEOS film 20 and the polysilicon layer 16 will be in the hydrophillic state because of the oxidizing nature of the peroxide. The hydrophillic surface could retain some impurities from the cleaning chemicals. Also, the TEOS film 22 and the polysilicon 16 will absorb moisture hydrogen from the ambient or from the wet cleaning process.

Figure 5:
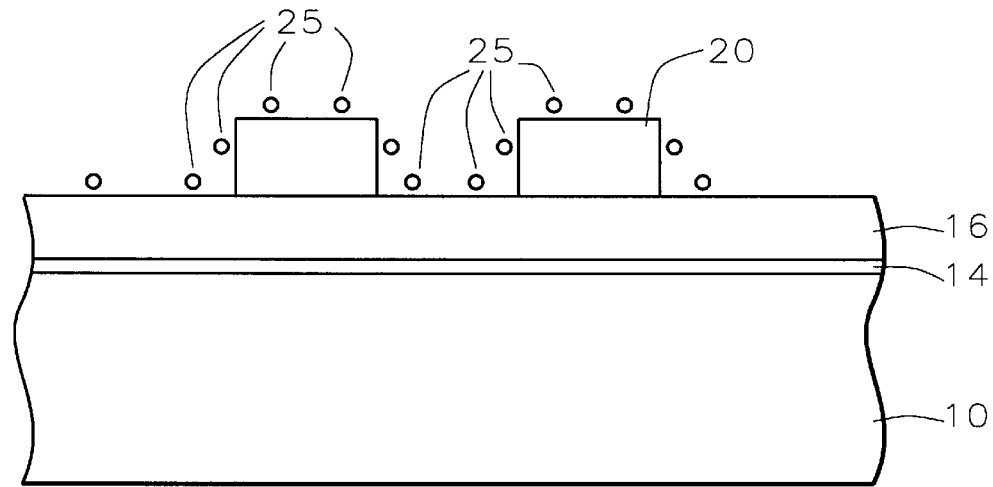

These impurities and moisture hydrogen form volatile defects 25, shown in FIG. 5. If these volatile defects are allowed to remain on the wafer surface, they will act as masks during the subsequent polysilicon etching step, causing unwanted polysilicon residue.

Figure 7:
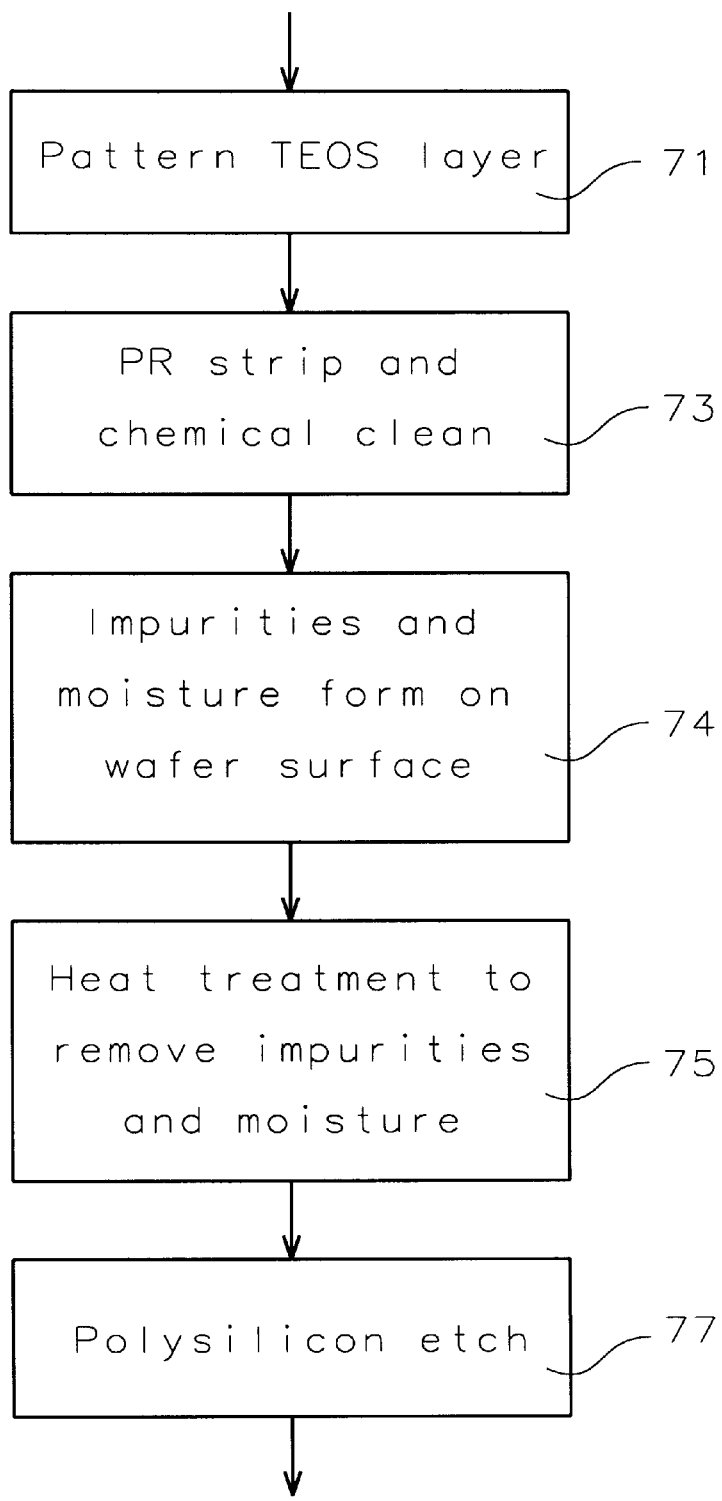
FIG. 7 is a flowchart of the process of the present invention.

The process of the present invention adds a heat treatment immediately following the chemical cleaning process described above. FIG. 7 is a flowchart showing the key process steps of the invention. The TEOS layer is patterned (step 71) followed by photoresist stripping and the chemical cleaning process (step 73). Impurities and moisture form on the surface of the wafer (step 74). The key feature of the present invention is the new step 75—heat treatment of the wafer to remove the impurities and moisture from the surface of the wafer. This heat treatment step is followed by the conventional polysilicon etch (step 77).

Figure 6:
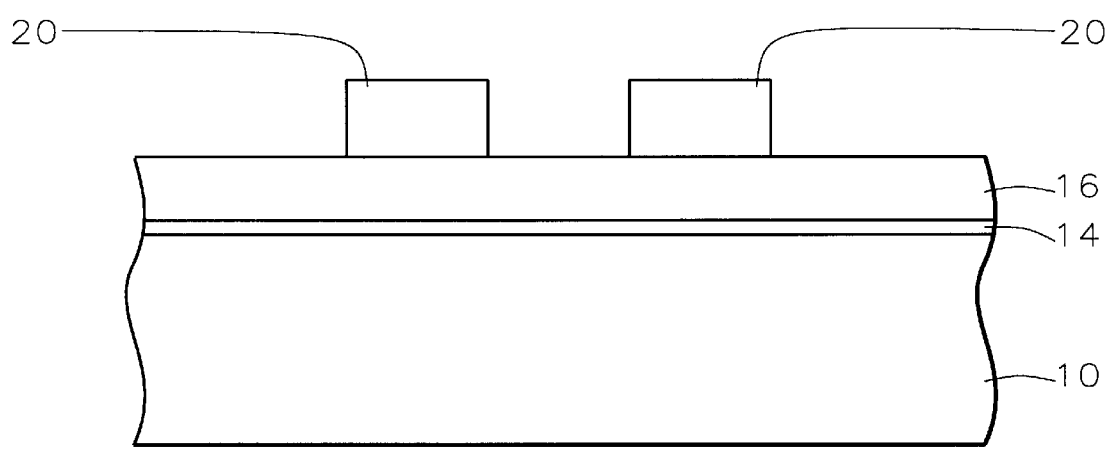

The new heat treatment step involves subjecting the wafer to a thermal treatment of between about 100 and 200° C. for between 1 and 2 minutes. The wafer may be heated by various methods, including in a furnace, by heat lamp, or on a hot plate. This heat treatment can effectively vaporize the volatile defects. FIG. 6 illustrates the wafer after the heat treatment of the present invention. The volatile defects 25 have been removed completely.

Figure 8:
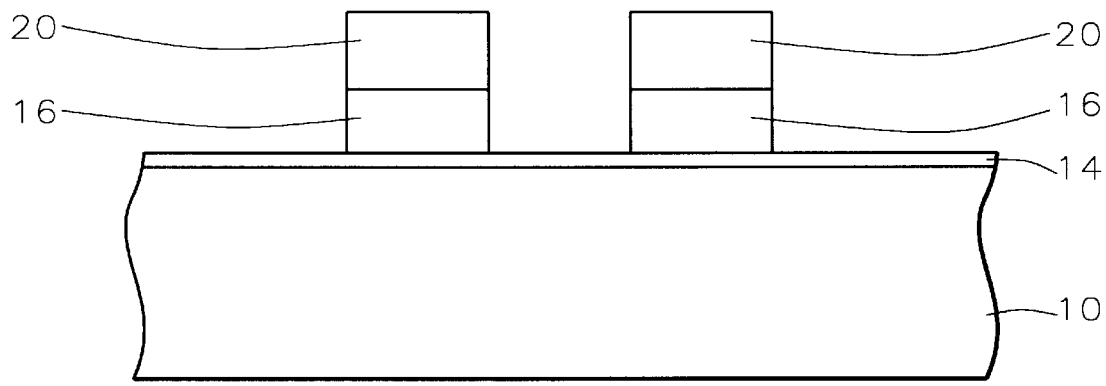

Referring now to FIG. 8, the polysilicon layer 16 is etched away where it is not covered by the TEOS oxide hard mask 20. No polysilicon residue results. The heat treatment of the present invention not only prevents polysilicon residue, but also improves dry etcher performance by reducing the moisture amount on the wafer.

The process of the present invention provides a simple and effective method of preventing polysilicon residue. The heat treatment of the present invention both prevents polysilicon residue and improves dry etcher chamber performance by reducing the amount of moisture on the wafer. The process of the present invention can be used in any application in which impurities and moisture remain on a wafer after a cleaning step.

Figure 9:
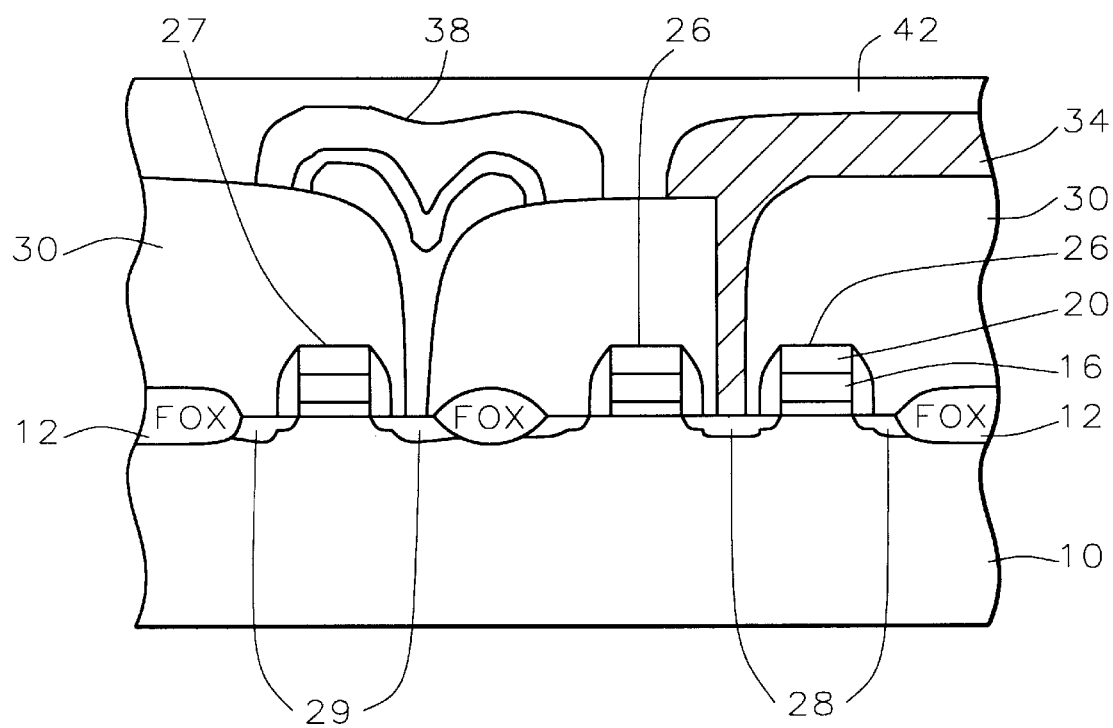
FIG. 9 schematically illustrates in cross-sectional representation a completed DRAM device fabricated by the process of the present invention.

For example, the process of the present invention can be used in the manufacture of a dynamic random access memory (DRAM) device such as that illustrated in FIG. 9. Semiconductor device structures such as logic transistors 26, memory transistor 27, and source and drain regions 28 and 29 are formed in and on the semiconductor substrate. Capacitor 38 and metal contact 34 are shown. For example, the heat treatment of the present invention can be used before etching the polysilicon transistors 26 and 27, as shown in the previous figures.

Polysilicon residue has been found in DRAM devices fabricated according to the prior art. The heat treatment process of the present invention has been found to prevent polysilicon residue in the fabrication of DRAM devices.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon line on a wafer in the fabrication of an integrated circuit comprising:

providing a dielectric layer over the surface of a semiconductor substrate;

depositing a polysilicon layer overlying said dielectric layer;

depositing a hard mask layer overlying said polysilicon layer and patterning said hard mask layer;

thereafter cleaning said wafer whereby surfaces of said wafer are hydrophillic and whereby moisture and impurities form volatile defects on said surfaces of said hard mask layer and said polysilicon layer after said cleaning;

thereafter heat treating said wafer whereby said volatile defects are removed; and thereafter etching away said polysilicon layer where it is not covered by said hard mask to complete formation of said polysilicon line on said wafer in the fabrication of said integrated circuit.

2. A method according to claim 1 wherein said polysilicon line is a gate electrode and said dielectric layer is a gate oxide layer.

3. A method according to claim 1 wherein said polysilicon line is a transistor in a DRAM integrated circuit device.

4. A method according to claim 1 wherein said hard mask layer comprises tetraethoxysilane (TEOS) oxide.

5. A method according to claim 1 wherein said step of cleaning said wafer comprises dipping said wafer into a solution containing peroxide.

6. A method according to claim 1 wherein said step of cleaning said wafer comprises dipping said wafer into a solution comprising one of the group containing $NH_4OH$—$H_2O_2$ (APM), HCl—$H_2O_2$ (HPM), and $H_2SO_4$—$H_2O_2$ (SPM).

7. A method according to claim 1 wherein said step of heat treating said wafer comprises exposing said wafer to heat at 100 and 200° C. for between 1 and 2 minutes.

8. A method of forming a polysilicon line on a wafer in the fabrication of an integrated circuit comprising:

providing a dielectric layer over the surface of a semiconductor substrate;

depositing a polysilicon layer overlying said dielectric layer;

depositing a hard mask layer overlying said polysilicon layer;

forming a photoresist mask over said hard mask layer;

etching away said hard mask layer where it is not covered by said photoresist mask;

removing said photoresist mask;

thereafter cleaning said wafer whereby surfaces of said wafer are hydrophillic, whereby said hydrophillic surfaces absorb moisture hydrogen and impurities from the ambient, and whereby said moisture hydrogen and impurities form volatile defects on said surfaces of said hard mask layer and said polysilicon layer after said cleaning;

thereafter heat treating said wafer whereby said volatile defects are removed; and thereafter etching away said polysilicon layer where it is not covered by said hard mask to complete formation of said polysilicon line on said wafer in the fabrication of said integrated circuit.

9. A method according to claim 8 wherein said polysilicon line is a gate electrode and said dielectric layer is a gate oxide layer.

10. A method according to claim 8 wherein said polysilicon line is a transistor in a DRAM integrated circuit device.

11. A method according to claim 8 wherein said hard mask layer comprises tetraethoxysilane (TEOS) oxide.

12. A method according to claim 8 wherein said step of cleaning said wafer comprises dipping said wafer into a solution containing peroxide.

13. A method according to claim 8 wherein said step of cleaning said wafer comprises dipping said wafer into a solution comprising one of the group containing $NH_4OH$—$H_2O_2$ (APM), $HCl$—$H_2O_2$ (HPM), and $H_2SO_4$—$H_2O_2$ (SPM).

14. A method according to claim 8 wherein said step of heat treating said wafer comprises exposing said wafer to heat at 100 and 200° C. for between 1 and 2 minutes.

15. A method of forming a polysilicon line on a wafer in the fabrication of an integrated circuit comprising:

providing a dielectric layer over the surface of a semiconductor substrate;

depositing a polysilicon layer overlying said dielectric layer;

depositing a TEOS oxide layer overlying said polysilicon layer;

forming a photoresist mask over said TEOS oxide layer;

etching away said TEOS oxide layer where it is not covered by said photoresist mask to leave a TEOS oxide hard mask overlying said polysilicon layer;

removing said photoresist mask;

thereafter cleaning said wafer by dipping said wafer into a solution containing peroxide whereby surfaces of said wafer are hydrophillic, whereby said hydrophillic surfaces absorb moisture hydrogen and impurities from the ambient, and whereby said moisture hydrogen and impurities form volatile defects on said surfaces of said hard mask layer and said polysilicon layer after said cleaning;

thereafter heat treating said wafer whereby said volatile defects are removed; and thereafter etching away said polysilicon layer where it is not covered by said hard mask to complete formation of said polysilicon line on said wafer in the fabrication of said integrated circuit.

16. A method according to claim 15 wherein said polysilicon line is a gate electrode and said dielectric layer is a gate oxide layer.

17. A method according to claim 15 wherein said polysilicon line is a transistor in a DRAM integrated circuit device.

18. A method according to claim 15 wherein said step of cleaning said wafer comprises dipping said wafer into a solution comprising one of the group containing $NH_4OH$—$H_2O_2$ (APM), $HCl$—$H_2O_2$ (HPM), and $H_2SO_4$—$H_2O_2$ (SPM).

19. A method according to claim 15 wherein said step of heat treating said wafer comprises exposing said wafer to heat at 100 and 200° C. for between 1 and 2 minutes.

* * * * *